US 6,553,550 B1

(12) United States Patent
Menegay et al.

(10) Patent No.: US 6,553,550 B1
(45) Date of Patent: Apr. 22, 2003

(54) METHOD AND APPARATUS FOR COMPUTING DELAY CORRELATION EFFECTS IN DIGITAL CIRCUITS

(76) Inventors: Peter Menegay, P.O. Box 10404, Blacksburg, VA (US) 24062-0404; Daniel L. Notestein, 520 Prices Fork Rd. #C1, Blacksburg, VA (US) 24060

( * ) Notice: Subject to any disclaimer, the term of this patent is extended or adjusted under 35 U.S.C. 154(b) by 0 days.

(21) Appl. No.: 09/517,917

(22) Filed: Mar. 3, 2000

Related U.S. Application Data
(60) Provisional application No. 60/122,868, filed on Mar. 5, 1999.

(51) Int. Cl.[7] ........................... G06F 17/50; G06F 19/00
(52) U.S. Cl. ................................. 716/6; 703/2; 703/15; 703/19; 702/125
(58) Field of Search ........................... 716/1–21; 703/2, 703/14–16, 19; 702/79, 117–118, 125, 179–182

(56) References Cited

U.S. PATENT DOCUMENTS

| | | | | |
|---|---|---|---|---|
| 4,924,430 A | * | 5/1990 | Zasio et al. | 716/6 |
| 5,392,221 A | * | 2/1995 | Donath et al. | 716/6 |
| 5,555,187 A | * | 9/1996 | Spyrou | 716/6 |
| 5,659,484 A | * | 8/1997 | Bennett et al. | 716/16 |
| 5,740,347 A | * | 4/1998 | Avidan | 714/33 |
| 5,764,528 A | * | 6/1998 | Nakamura | 716/6 |
| 5,859,776 A | * | 1/1999 | Sato et al. | 700/121 |
| 5,870,308 A | * | 2/1999 | Dangelo et al. | 716/18 |
| 5,883,808 A | * | 3/1999 | Kawarabayashi | 716/2 |
| 5,889,677 A | * | 3/1999 | Yasuda et al. | 716/6 |
| 5,956,257 A | * | 9/1999 | Ginetti et al. | 716/3 |
| 6,023,568 A | * | 2/2000 | Segal | 716/6 |
| 6,046,984 A | * | 4/2000 | Grodstein et al. | 713/500 |
| 6,131,182 A | * | 10/2000 | Beakes et al. | 716/8 |
| 6,181,320 B1 | * | 1/2001 | Fredrickson | 345/440 |
| 6,209,122 B1 | * | 3/2001 | Jyu et al. | 716/6 |
| 6,286,126 B1 | * | 9/2001 | Raghavan et al. | 716/6 |
| 6,457,159 B1 | * | 9/2002 | Yalcin et al. | 716/6 |

OTHER PUBLICATIONS

NA8908260 ("Timing Verification of Algorithmically Grown Macros", IBM Technical Disclosure Bulletin, vol. 32, No. 3A, Aug. 1989, pp. 260–262 (5 pages)).*
NN9601397 ("Modelling Process Variation in System–Level Static Timing", IBM Technical Disclosure Bulletin, vol. 39, No. 1, Jan. 1996, pp. 397–402 (11 pages)).*
Chu et al. ("Efficient timing analysis for general synchronous and asynchronous circuits", Proceedings of Third Annual IEEE ASIC Seminar and Exhibit, Sep. 17, 1990, pp. P5/4.1–p5/4.4).*
Venkatesh et al. ("Timing abstraction of intellectual property blocks", Proceedings of the IEEE 1997 Custom Integrated Circuits Conference, May 5, 1997, pp. 99–102).*
Balajee et al. ("Automated AC (timing) characteristic for digital circuit testing", Proceedings of 1998 Eleventh International Conference on VLSI Design, Jan. 4, 1998, pp. 374–377).*

* cited by examiner

Primary Examiner—Matthew Smith
Assistant Examiner—Phallaka Kik

(57) ABSTRACT

A method to automate techniques for using delay correlation effects to optimize the design of digital circuits, including a graphical method of data-entry and an optimized calculation scheme. It is used in conjunction with, or is part of, a computer program which performs timing analysis of digital circuits. The method calculates the time difference between two user-input timing paths in a circuit which include delay ranges for each gate in the paths along with correlation factors between any pair of gates. The method checks the user-input to determine an optimal calculation procedure. If none exists, it resorts to a calculation based on a sequential search of many possible timing states.

6 Claims, 13 Drawing Sheets

| D1 (ns) | 0% | D2: delay range with correlation 100% | 80% | 20% |
|---|---|---|---|---|
| 5 | 0-5 ns | 0 ns | 0-1 ns | 0-4 ns |
| 6 | 0-5 | 1 | 0-2 | 0-5 |
| 7 | 0-5 | 2 | 1-3 | 0-5 |
| 8 | 0-5 | 3 | 2-4 | 0-5 |
| 9 | 0-5 | 4 | 3-5 | 0-5 |
| 10 | 0-5 | 5 | 4-5 | 1-5 |
| D1-D2: | 0-10 | 5 | 4-6 | 1-9 |

|     | C1   | C2     | C3     | C4     | C5     | C6     | C7     | C8     |
|-----|------|--------|--------|--------|--------|--------|--------|--------|
| R1  | ABCD | A      | $B_A$  | $C_A$  | $C_B$  | $D_A$  | $D_B$  | $D_C$  |
| R2  | 1234 | 10,20 | 0, 5 | 50,56 | 50,60 | 30,31 | 33,37 | 30,39 |
| R3  | 1243 | 10,20 | 0, 5 | 30,31 | 33,37 | 50,56 | 50,60 | 50,60 |
| R4  | 1324 | 10,20 | 50,56 | 0, 5 | 0, 7 | 30,31 | 30,39 | 33,37 |
| R5  | 1342 | 10,20 | 50,56 | 30,31 | 30,39 | 0, 5 | 0, 7 | 0, 3 |
| R6  | 1423 | 10,20 | 30,31 | 0, 5 | 0, 3 | 50,56 | 50,60 | 50,60 |
| R7  | 1432 | 10,20 | 30,31 | 50,56 | 50,60 | 0, 5 | 0, 3 | 0, 7 |
| R8  | 2134 | 0,10 | 15,20 | 53,60 | 50,60 | 38,40 | 34,36 | 30,40 |
| R9  | 2143 | 0,10 | 15,20 | 38,40 | 34,36 | 53,60 | 50,60 | 50,60 |
| R10 | 2314 | 0,10 | 53,60 | 15,20 | 10,19 | 38,40 | 30,40 | 34,36 |
| R11 | 2341 | 0,10 | 53,60 | 38,40 | 30,40 | 15,20 | 10,19 | 19,20 |
| R12 | 2413 | 0,10 | 38,40 | 15,20 | 19,20 | 53,60 | 51,60 | 53,60 |
| R13 | 2431 | 0,10 | 38,40 | 53,60 | 51,60 | 15,20 | 19,20 | 10,19 |
| R14 | 3124 | 50,60 | 10,16 | 0, 7 | 0, 5 | 30,39 | 30,31 | 33,37 |
| R15 | 3142 | 50,60 | 10,16 | 30,39 | 30,31 | 0, 7 | 0, 5 | 0, 3 |
| R16 | 3214 | 50,60 | 0, 7 | 10,16 | 12,20 | 30,39 | 35,39 | 31,33 |
| R17 | 3241 | 50,60 | 0, 7 | 30,39 | 35,39 | 10,16 | 12,20 | 18,20 |
| R18 | 3412 | 50,60 | 30,39 | 10,16 | 18,20 | 0, 7 | 7,10 | 3,10 |
| R19 | 3421 | 50,60 | 30,39 | 0, 7 | 7,10 | 10,16 | 18,20 | 12,20 |
| R20 | 4123 | 30,40 | 19,20 | 8,10 | 4,10 | 51,60 | 53,60 | 53,60 |
| R21 | 4132 | 30,40 | 19,20 | 51,60 | 53,60 | 8,10 | 4,10 | 0,10 |
| R22 | 4213 | 30,40 | 8,10 | 19,20 | 15,20 | 51,60 | 53,60 | 53,60 |
| R23 | 4231 | 30,40 | 8,10 | 51,60 | 53,60 | 19,20 | 15,20 | 10,19 |
| R24 | 4312 | 30,40 | 51,60 | 19,20 | 10,17 | 8,10 | 0, 8 | 4,10 |
| R25 | 4321 | 30,40 | 51,60 | 8,10 | 0, 8 | 19,20 | 10,17 | 13,20 |
| R26 |      |        |        |        |        |        |        |        |
| R27 | 2341 | 0,10 | 50,57 | 30,32 | 30,40 | 10,15 | 11,20 | 10,11 |

Figure 11

|     | C1   | C2 | C3 | C4 | C5 | C6  | C7          |
|-----|------|----|----|----|----|-----|-------------|
| R1  | ABCD | A  | B  | C  | D  | Y/N | (1+3)-(2+4) |
| R2  | 1234 | 10 | 5  | 50 | 31 | N   | --          |
| R3  | 1243 | 10 | 5  | 31 | 50 | N   | --          |
| R4  | 1324 | 10 | 50 | 5  | 31 | N   | --          |
| R5  | 1342 | 10 | 50 | 31 | 3  | Y   | 26          |
| R6  | 1423 | 10 | 31 | 3  | 50 | Y   | 26          |
| R7  | 1432 | 10 | 31 | 50 | 3  | Y   | 26          |
| R8  | 2134 | 10 | 15 | 53 | 36 | N   | --          |
| R9  | 2143 | 10 | 15 | 36 | 53 | N   | --          |
| R10 | 2314 | 10 | 53 | 15 | 36 | N   | --          |
| R11 | 2341 | 10 | 53 | 40 | 19 | Y | 22 |
| R12 | 2413 | 10 | 40 | 19 | 53 | Y   | 22          |
| R13 | 2431 | 10 | 40 | 53 | 19 | Y   | 22          |
| R14 | 3124 | 50 | 10 | 5  | 31 | N   | --          |
| R15 | 3142 | 50 | 10 | 31 | 3  | Y   | 26          |
| R16 | 3214 | 50 | 7  | 12 | 33 | N   | --          |
| R17 | 3241 | 50 | 7  | 39 | 18 | N   | --          |
| R18 | 3412 | 50 | 39 | 18 | 7  | N   | --          |
| R19 | 3421 | 50 | 39 | 7  | 18 | N   | --          |
| R20 | 4123 | 40 | 19 | 10 | 53 | Y   | 22          |
| R21 | 4132 | 40 | 19 | 53 | 10 | Y   | 22          |
| R22 | 4213 | 40 | 10 | 19 | 53 | Y   | 22          |
| R23 | 4231 | 40 | 10 | 53 | 19 | Y   | 22          |
| R24 | 4312 | 40 | 51 | 19 | 8  | N   | --          |
| R25 | 4321 | 40 | 51 | 8  | 19 | N   | --          |
| R26 |      |    |    |    |    |     |             |
| R27 | 2341 | 0 | 57 | 30 | 11 | Y | 38 |

Figure 12

$Given : [a_1, b_1],$ $x_1 \in [a_1, b_1],$ $[a_2, b_2],$ $cf$ $Find : [x_2, y_2] \in [a_2, b_2]$ $Solution :$ $$r = (1 - cf)(b_2 - a_2)$$

$$C = a_2 + \frac{b_2 - a_2}{b_1 - a_1}(x_1 - a_1)$$

$$x_2 = \max[(C - r), a_2]$$

$$y_2 = \min[(C + r), b_2]$$

METHOD AND APPARATUS FOR COMPUTING DELAY CORRELATION EFFECTS IN DIGITAL CIRCUITS

This application claims the benefit of No. 60/122,868, filed Mar. 5, 1999.

CROSS-REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE INDEX

Not Applicable.

BACKGROUND OF THE INVENTION

This invention relates in general to timing analysis and verification of integrated circuit designs, and in particular to a computer method which enables said analysis to be performed using correlated relationships between the delays that normally occur in components of such circuits.

One of the most important steps in digital design is performing a timing analysis to determine if the circuit meets logic and performance requirements. The essence of such an analysis is determining whether a signal arrives at its destination within some time limit so that it may successfully interact with other signals and logic components. Many signals and time constraints (up to thousands or millions) exist in a modern digital logic chip. The traditional method of timing analysis, pencil and paper, quickly overwhelms a design engineer for a large circuit. Fortunately, the recent past has seen the emergence of computer programs which automate the construction of complex timing models. The designer enters timing and signal information graphically and the program automatically computes whether the circuit meets timing requirements or not. Design optimization can proceed relatively quickly since information does not have to be completely re-entered each time a change is conceived.

Several timing analysis software packages are available on the open market. U.S. Pat. No. 5,576,979 refers to one such product by Chronology™ Corp. Synapticad, Inc. manufactures another one called WaveFormer Pro™. In addition, related products, such as circuit simulators and static timing analyzers, exist which can do timing analysis. These products will be described in greater detail later, especially as they relate to delay correlation.

The critical data entered into a timing analysis includes the signals produced by logic components (or clocks), and the delays associated with these components and their interconnections. Also entered are any timing requirements such as the fact that a signal should arrive at a particular component a certain time before some other signal. Delay times are generally expressed as a range (e.g. 5–10 ns) because there is some uncertainty associated with high volume component manufacture and circuit operating conditions. Delay times are given to the designer by the chip component manufacturer. Traditionally, designers have assumed that the entire uncertainty range for each component should be accounted for independently of the other delays. Therefore, the time difference between any two delays must be calculated assuming that one is at its maximum time and the other at its minimum time. This forces the design to meet a worst-case analysis where the most conservative clock speed is chosen.

However, it is known that components placed on the same circuit have some correlation between their delay times. If one component has an actual delay time at the high end of its uncertainty range, others on the same circuit will tend to be at the high end also. This results from similarities in the manufacturing process used to make the gates, similar operating temperature, and physical proximity. Chip manufacturers are beginning to publish this type of correlation information in their design handbooks. This data is furnished in terms of a correlation factor between two gates, i.e. a percentage or a fraction between 0–1. It is determined by empirical measurements of the delay speeds for gates in a circuit.

Delay correlation allows a better than worst-case analysis to be used in design. This is because correlated gates have a reduced time difference between their outputs. This reduction can be thought of as a time savings which can, in turn, be translated into a corresponding increase in clock speed.

A simple example will better illustrate the concept of delay correlation. FIG. 1 shows two gates each having some propagation delay range. D1 ranges from 5–10 ns and D2 ranges from 0–5 ns. If the two gates have no delay correlation (the usual assumption) then the actual delay times for each could fall anywhere in the shown ranges. For instance, if D1=10 ns, then D2 could have a delay time as low as 0 ns. We will call this condition 0% correlation.

At the other end of the spectrum is 100% correlation. This means that if D1=5 ns, then D2=0 ns. If D1=7.5 ns then D2 will be at 2.5 ns, and so forth. Clearly 100% correlation greatly reduces the difference between the two delays.

What happens for, say, 80% correlation? If D1=5 ns, then D2 will be in the range 0–1 ns. In other words the possible range for D2 spans 20% (100%–80%) of its total range. Now, if D1=10 ns, then D2 would have a range of delay times from 4–5 ns. This is because the D2 range is ±20% around 5 ns, it's corresponding point. Obviously, since a higher delay time than 5 ns is not possible, the range is 4–5 ns rather than 4–6 ns.

By inspecting the table in FIG. 1 we can calculate the minimum and maximum differences between the delays for each correlation factor. For 0% correlation, the difference works out to 0–10 ns, for 100% it is exactly 5 ns, and for 80% it is 4–6 ns. These numbers, tabulated in FIG. 1, illustrate the effect of delay correlation on time differences between events.

The change in these differences as correlation factor increases allows for a faster circuit design. For 100% correlation, the designer knows that D1 will always arrive 5 ns after D2. For 0%, D1 could arrive as much as 10 ns after D2. The uncorrelated circuit is, in effect, 5 ns slower than the perfectly correlated one.

The differences given in FIG. 1 can be arrived at through two equations. The first expresses the minimum time of arrival of D1 with respect to D2:

$$\Delta_{min}=a_1-b_2+\min[(b_1-a_1),(b_2-a_2)]cf \quad (1)$$

The second expresses the maximum time of arrival of D1 with respect to D2:

$$\Delta_{max}=b_1-a_2-\min[(b_1-a_1),(b_2-a_2)]cf \quad (2)$$

Note that negative answers indicate that D1 arrived before D2. Also note that by reversing the sign on each equation, we obtain the time of arrival of D2 with respect to D1.

Given the benefits of delay correlation, it is the purpose of this invention to incorporate a general method for calculating it into computer programs for timing analysis. Although variations on the concept have been incorporated into other timing analysis products, none has done so in the general manner that is proposed here. To confirm this point, a review of the prior art will now be made.

Several timing analysis software packages are and have been available on the open market. The first such product was called dV/dt® by Engineerium™, a company no longer doing business. The product featured a windowed environment where the user could graphically create timing diagrams and analyze the corresponding timing relationships. No features existed where delay correlation relationships could be entered or calculated, so the product based its timing analysis on a worst-case scenario.

U.S. Pat. No. 5,576,979 refers to another such product by Chronology™ Corp., known as TimingDesigner®. This product also includes a windowed timing diagram editing environment, but in addition has a feature which enables signal skews to be included in the analysis. This feature was developed in attempt to model delay correlation in a specific situation, the case of clock buffers. Because data sheets commonly attach a parameter called skew which related two signals of the buffer, Chronology added a feature to allow entry of a skew value and associated computation to adjust for the reduction of uncertainty between output edges in this particular case. This modeling technique has a serious flaw, however. In particular, signal skews as used in the U.S. Pat. No. 5,576,979 patent can only be applied to entire signals, because they presuppose that a single delay acts on one signal, while another single delay acts on another signal. This is a common situation in a clock buffer, where each buffer gate corresponds to a signal, but the gates are highly correlated with respect to each other because they are part of the same buffer. Thus, a signal skew calculation effectively means the consideration of delay correlation between only two delays. This is a valid representation for common, albeit very simplified, situations. In contrast, the invention described here is capable of analyzing any number of interacting delays in any two paths and the correlation relationships are between delays, not signals.

Another similar product for timing analysis includes Synapticad's™ WaveFormer Pro®, which has reduced to practice the complete delay correlation analysis as described in this invention. WaveFormer Pro contains additionally a graphical user interface, comprised of a timing diagram editor and dialog boxes, for conveniently entering delay and delay correlation information for any integrated circuit design.

Other products for timing analysis and verification include circuit simulators and timing analyzers, which traditionally have not included delay correlation, but use instead a worst-case analysis. Generally these products are used for post-verification of circuit performance, rather than design. One such product that does include, again a simplified form of delay correlation, is Mentor-Graphics'™ Tau® product. Like Chronology's product, this one is also able to perform signal skews, but not multiple correlation between any number of individual delays.

Delay correlation, however, is a known concept in the art of timing analysis and verification. Girodias and Cerny (Girodias, P. and Cerny, E., "Interface Timing Verification with Delay Correlation Using Constraint Logic Programming", *Proceedings of the* 1997 *European Design and Test Conference*) published work in which they use a programming technique known as constraint logic programming to verify timing in integrated circuits. The technique is able to make use of delay correlation, however, it uses an iterative method fundamentally distinct from the one that is described by this invention. In particular, the technique enumerates possible timing values for the components in the circuit and then verifies if these yield a correct timing analysis. By iterating over many such possible values, the algorithm is able to determine whether a timing violation has occurred. Thus, this technique amounts to a "brute force" walk-through of likely states. Although conceptually sound, this method was avoided here because it is prohibitively expensive in terms of computer time for large circuits (standard workstations begin to perform poorly using the brute force method when as few as eight delays are included in a single computational chain). In Cerny's paper he discusses analyzing timing diagrams with as many as 50 delays, but these delays are not in a single computational chain and hence are still solvable by brute force techniques. When delays are included in a chain, however, the memory and CPU requirements increase rapidly using the brute force method as additional delays are added. Furthermore, Cerny and Girodias' method does not handle correlation between timing constraints, such as setups or holds, constraints which can be correlated and taken into account during a correlation analysis.

The method described by this invention is thus unique not only as an idea, but also because it makes better use of computer resources than existing techniques in the prior art.

BRIEF SUMMARY OF THE INVENTION

To overcome limitations in the prior art, and to overcome other limitations that will become apparent upon reading and understanding this specification, the present invention discloses a method of a computer program which automates the entry, modification, and computation of delay correlation effects in digital electronic circuits. This feature is integrated to and works with computer programs which perform many general timing analysis and verification functions. Such computer programs could include timing verification/viewing/editing tools, circuit simulators, or static timing analyzers.

BRIEF DESCRIPTION OF THE SEVERAL VIEWS OF THE DRAWING

FIG. 10 is a representation of a table used by the invention to calculate time differences for a general two-path network.

FIG. 11 is a representation of a second table used by the invention to calculate time differences for a general two-path network.

FIG. 12 is a set of equations used in the solution of a general two-path network problem.

DETAILED DESCRIPTION OF THE INVENTION

The following embodiment is a specific illustration of how the invention may be practiced. It is to be understood that other embodiments may be utilized and structural changes may be made without departing from the scope of the present invention.

Figure 1:
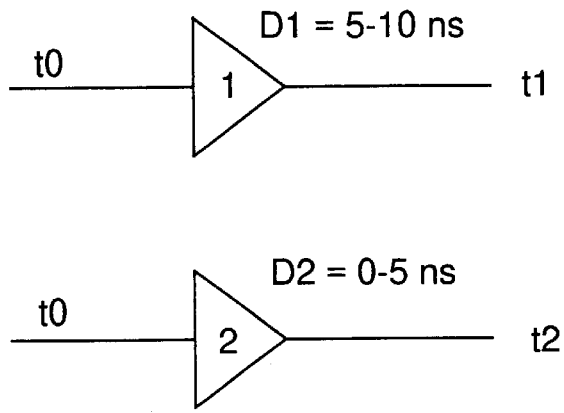
FIG. 1 is a diagram of two delay-correlated gates and a corresponding tabular analysis of delay correlation effects.
Figure 2:
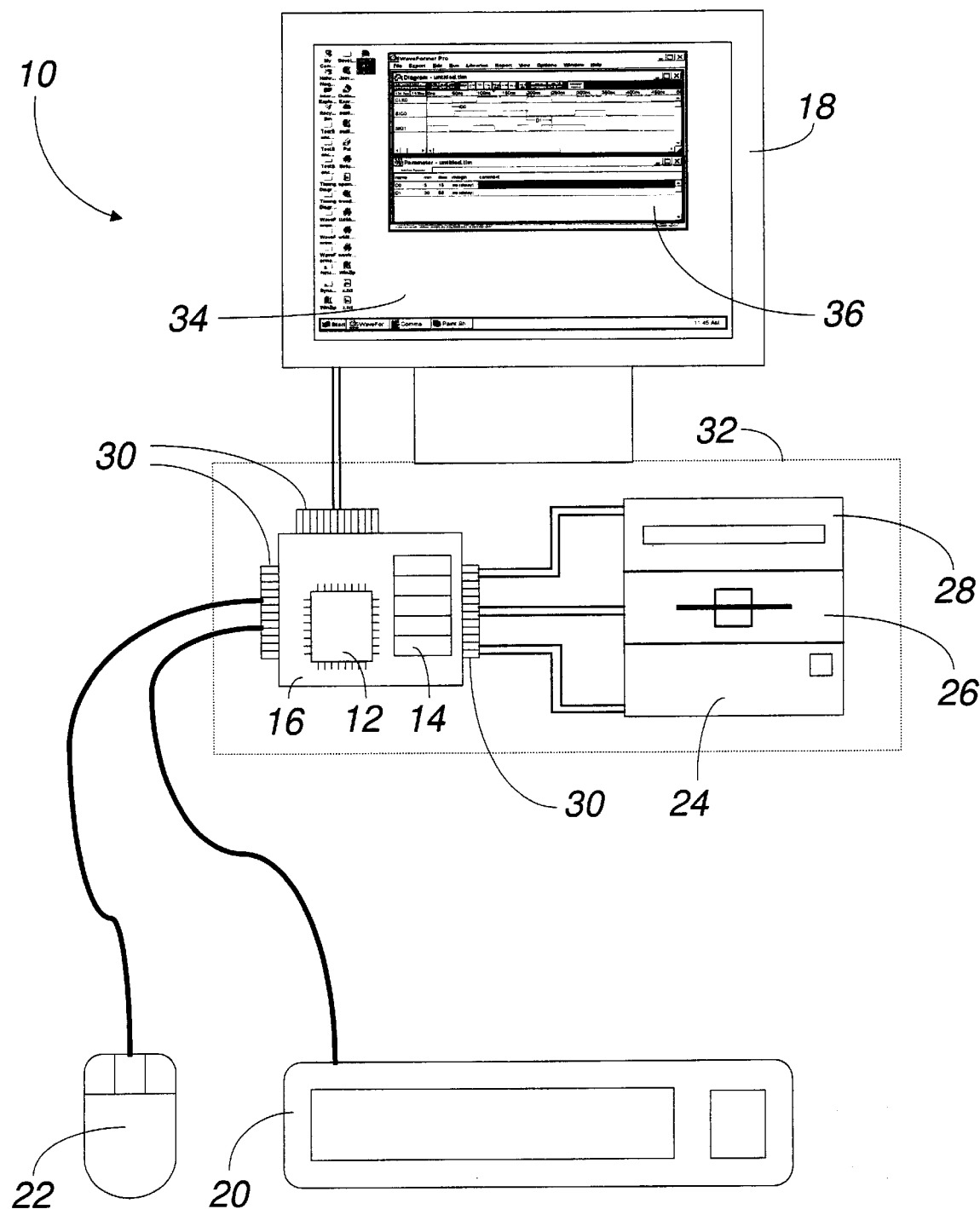
FIG. 2 is a diagrammatic representation of a computer used in conjunction with the preferred embodiment of the invention.

This embodiment of the invention operates on a personal computer or workstation 10, as in FIG. 2. Said computer is comprised of a central processing unit (CPU) 12, volatile memory known as RAM 14, a system board 16 to which 12 and 14 are affixed, a monitor 18, user input devices consisting of a keyboard 20 and mouse 22, non-volatile memory known as a hard disk 24, and a floppy drive 26 and CD drive 28 by which portable stored data may be introduced. The devices 18–28 are connected to the system board 16 through various electronic adapters 30. A metal housing 32 encloses the devices 12–16 and 24–30 for physical protection and insulation from electromagnetic interference. The hard disk 24 contains a computer program known as an operating system 34 which produces a human-computer interface of a graphical nature on monitor 18 when loaded into volatile memory 14, i.e. when computer power is turned on. Examples of operating systems include Windows NT™ manufactured by Microsoft Corp., Solaris™ by Sun Corp., and Mac OS8™ by Apple Corp. The operating system also includes sub-programs which allow the computer to interact with components such as the monitor 18 or the keyboard 20. It is not the purpose of this specification to describe how the computer and operating system work since these details are readily available in the open literature and known to those skilled in the art.

Hard disk 24 contains a timing analysis computer program 36 used for drawing, viewing, analyzing, and verifying timing relationships in digital electronic circuits. This computer program operates within the graphical interface produced by operating system 34. It is activated by double-clicking an icon bearing its name, by selecting it from a menu of options, or by typing its name at a command prompt. Activation causes the program to be transferred from the hard disk 24 to RAM 14 where it can be processed by the CPU 12 and displayed on the monitor 18. Timing analysis computer programs are well known to digital design engineers and have been referenced in the literature (see U.S. Pat. No. 5,576,979, 5,381,524, or U.S. Pat. No. 5,790,435). For example, this embodiment will refer to one such computer program as WaveFormer, a product of Synapticad, Inc.

Figure 3:
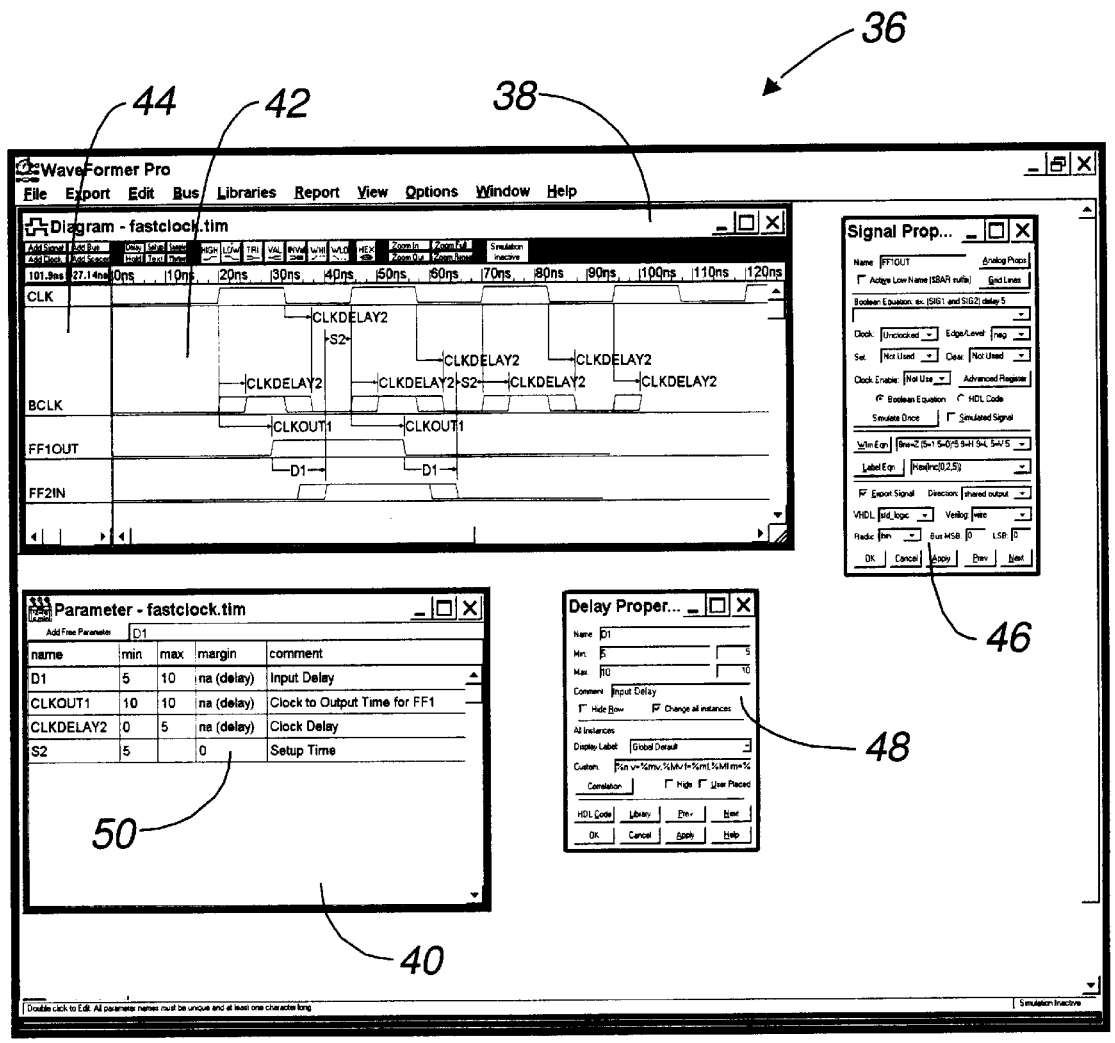
FIG. 3 is a representation of the user interface displays utilized in the preferred embodiment of the invention.

FIG. 3 illustrates the user interface 36 of WaveFormer. Timing diagrams are drawn in a diagram window 38, and a table of variables, upon which a timing verification is based, is entered in a parameter window 40. This particular diagram and table is based on the example digital circuit shown in FIG. 4. The nature of WaveFormer is described by using it to perform a timing verification of this circuit. Later, the delay correlation capability of WaveFormer is described.

Figure 4:
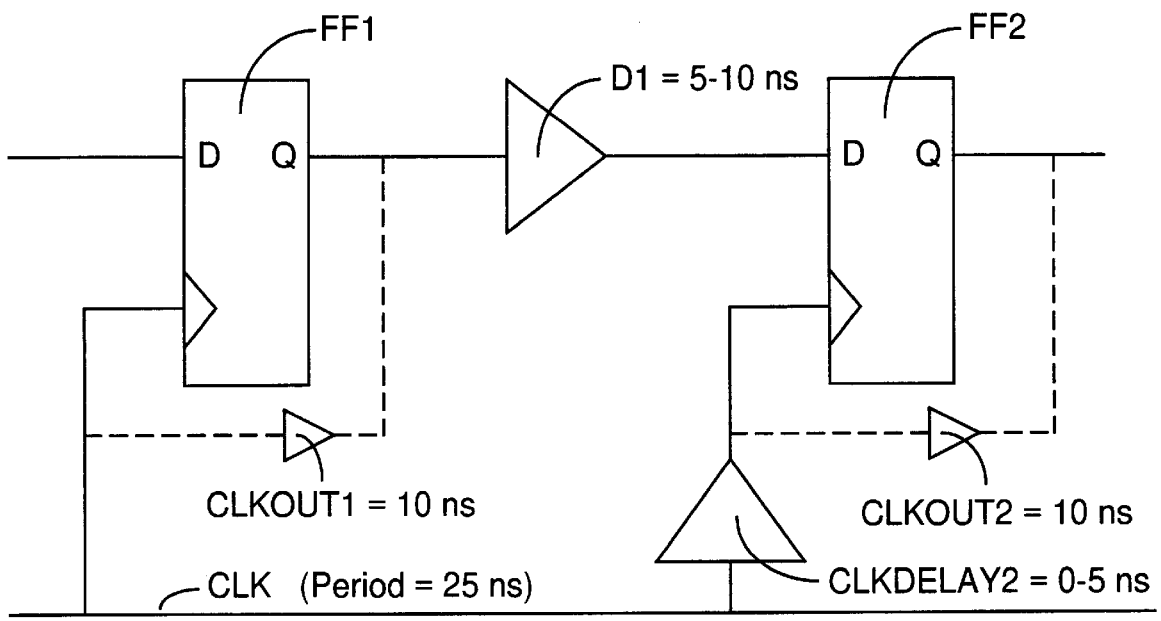
FIG. 4 is an example digital circuit which is analyzed using the invention.

The digital circuit of FIG. 4 is comprised of flip-flop FF1, flip-flop FF2, an interconnection between them having some propagation delay D1, a clock line CLK, delay CLKOUT1 representing the time required for a signal to propagate through flip-flop FF1, delay CLKOUT2 representing the time required for a signal to propagate through flip-flop FF2, and a buffer CLKDELAY2 with some delay associated with it representing the time required for a clock signal to traverse from the clock line CLK to the input of flip-flop FF2. For purposes of this example it is assumed that delay D1 is between 5 ns and 10 ns. Also the delays CLKOUT1 and CLKOUT2 are assumed to be 10 ns. Delay CLKDELAY2 is furthermore assumed to be within the interval 0–5 ns, as shown.

It would be known to a circuit design engineer that the digital signal traversing interconnect delay D1 must arrive at flip-flop FF2 before the clock signal does. In fact, the signal must precede the clock by at least a certain time, known as the setup time. It is assumed here that the setup time requirement is 5 ns. The objective of a timing verification is thus to establish that this setup time is not violated.

Given the circuit of FIG. 4, said verification is performed using WaveFormer in the following manner. With reference to FIG. 3, upon activation of the program, two windows appear on the screen, the diagram window 38, and the parameter window 40. The diagram window 38 is comprised of a drawing pad 42 especially designed to allow digital signals to be entered using a mouse, and a name block 44 which holds the names of the drawn signals. The user can enter in freeform manner the signals that are desired for analysis, or alternatively may invoke a dialog box 46 in which a boolean equation may be entered to represent the signal. The dialog box 46 allows other properties of the signal, such as its name, to also be entered. The four signals shown in diagram window 38 are entered accordingly.

Next, delay and setup times are added to the diagram. This is also done within the drawing pad 42 using the mouse. By clicking on the appropriate signal edges, a delay or setup may be graphically placed on the diagram. Furthermore, by double-clicking on the delay or setup once it is created, a dialog box 48 is activated which permits the entry of additional information, such as the range of delay times.

All delays and setups are automatically tabulated, along with their names and values, in parameter window 40. This window includes a table entry 50 which is the value of the margin for the setup time of interest (S2). Margin is defined as the difference between the actual setup time and the required setup time, and for this case is:

$$\text{margin} = \text{CLKPERIOD} - \text{CLKOUT1} + (\text{CLKDELAY2} - D1) - S2 \quad (3)$$

If the value in the margin column is greater than or equal to zero, then the setup time requirement has not been violated, and the circuit design is logically sound. If this value is less than zero, then the setup time has been violated, and the circuit design is logically unsound. This value is calculated automatically each time changes to any other parameters in the circuit are made. Thus, the engineer can readily inspect the effects of design modifications.

The aforementioned procedure for timing verification was done with no mention of delay correlation effects. By default, if the delay correlation feature is not specifically invoked, WaveFormer assumes that a worst case analysis is to be performed (i.e., all correlation factors equal to zero). This type of analysis is what is typically done by circuit designers. Now, improvements to the design will be illustrated through the use of delay correlation.

Figure 5:
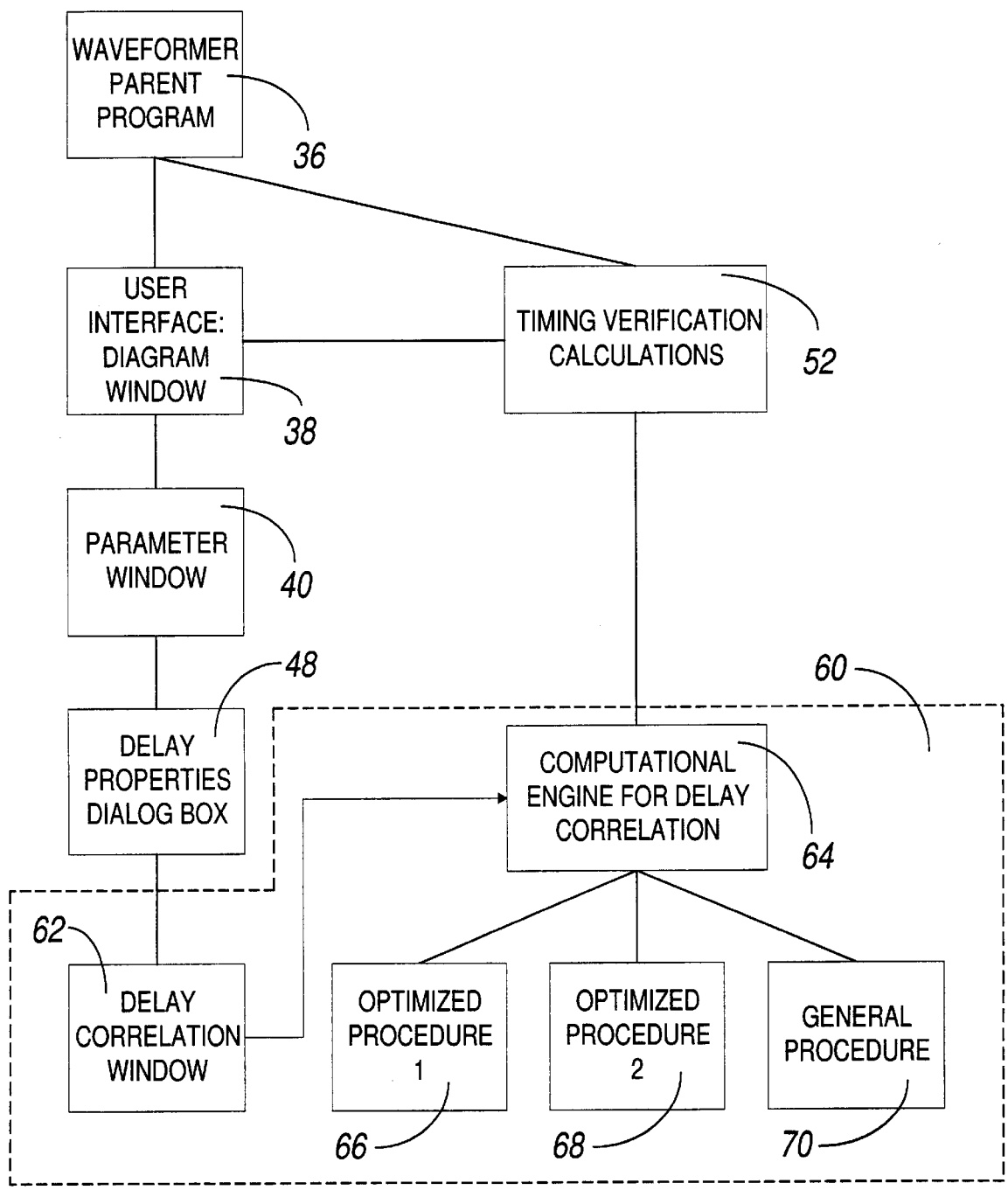
FIG. 5 is a block diagram showing the relationship, in the preferred embodiment of the invention, between the delay correlation sub-program and its parent program.

In this embodiment, and with reference to FIG. 5, delay correlation techniques are automated through a subprogram 60 dedicated especially to this task. Like its parent 36, the subprogram consists of a user interface 62 and a computational engine 64. The user interface 62 consists of a window in which the user can enter relevant data regarding delays. In particular, each delay is grouped into a set of delays having the same correlation information, which in this case consists of a percentage. This interface eases both entry and modification of the correlation data. The computational engine 64 is invoked during the parent program's procedure for timing calculations 52. It consists of two optimized procedures, 66 and 68, and a general procedure 70. Certain simplified circuits are preferably handled using an optimized procedure, which is computationally quicker. The general procedure is reserved for more complex cases. The computational engine is based on equations 1 and 2 which are used in all three procedures. The user interface 62 communicates with the computational engine 64 by giving it the relevant data input. When calculations are complete, the results are fed back to the timing verification procedure 52 and on to the parameter window 40 and diagram window 38.

In general, the subprogram 60 comprises a group of functions within the parent program 36. Each function requires a set of variables as input, and outputs the result of a specific task such as the result of a mathematical formula. Implementation of the subprogram, together with the parent program, was done using the Microsoft Visual C++™ programming system. It should be emphasized, however, that a great variety of computer languages and systems could have been used to achieve essentially the same result. Furthermore, a great variety of differences can exist regarding the syntax and structure of the lines of programmed code. For this reason and because these topics are well known in the art, no further attempt is made to discuss them here.

In order to include the effects of delay correlation, the user clicks on the correlation button 49 inside the delay properties window 48 (FIG. 6), causing a window 62 to appear which enables the user to enter correlation information. Doing so allows the delay to be correlated with another delay or another group of delays having the same correlation factor.

Figure 6:
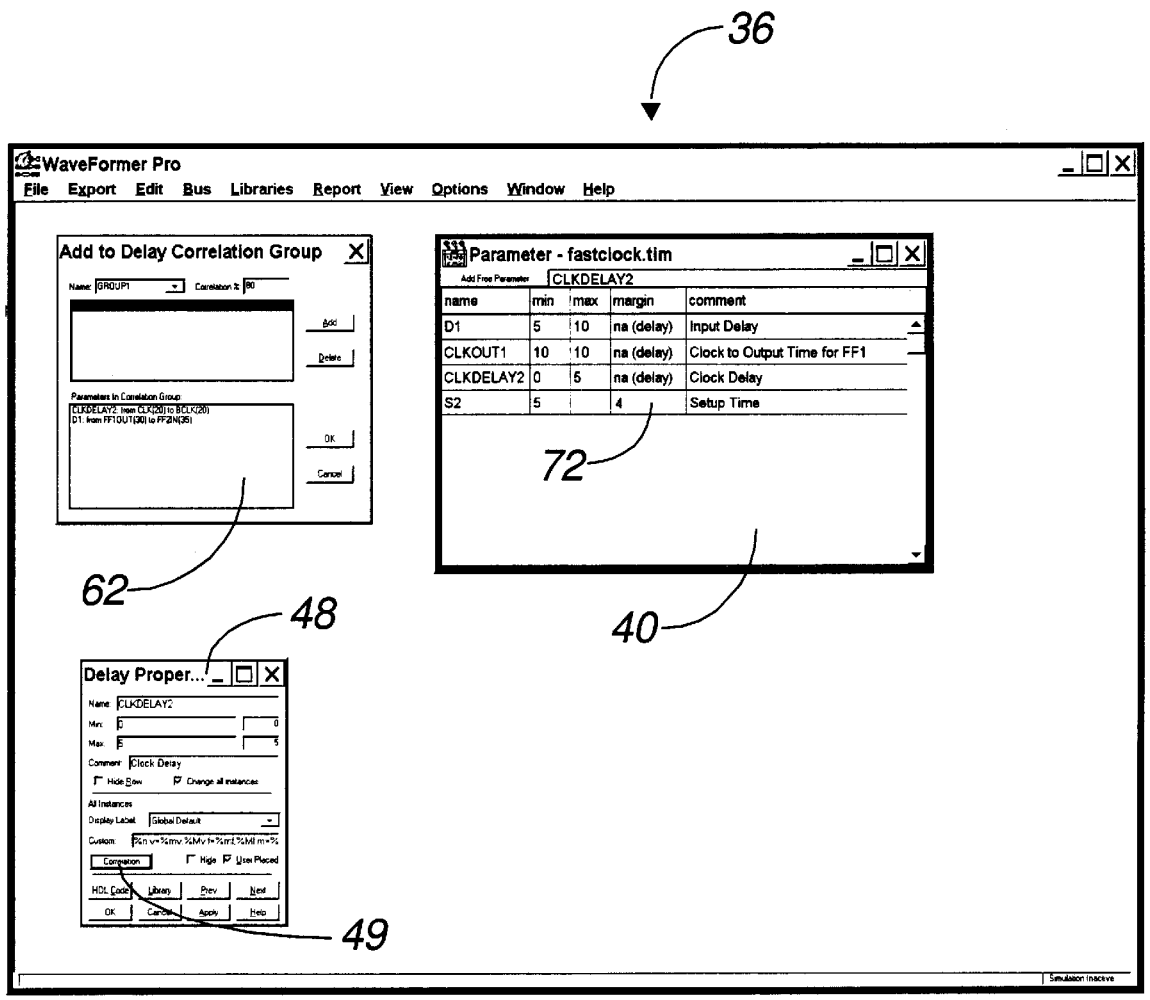
FIG. 6 is a representation of the preferred embodiment of a user-interface display of the invention.

FIG. 6 shows the delay correlation window 62 in which gate delays are grouped into sets which have the same correlation factor. The user is thus able to express the correlation between any two gates of the circuit. If no correlation is explicitly set, the computer program assumes that it is zero. The program is designed so that only one correlation factor can exist between any two gates. If the user attempts to set a correlation factor for any pair of gates that has already been set, the program will accept the input only under the condition that the original input is forgotten.

For example, for the same circuit described above (FIG. 4) we shall assume that a correlation factor of 80% exists between CLKDELAY2 and D1. This information is readily entered into the delay correlation window 62 by creating a group name and then associating previously created delays with the group. The group is given a correlation factor such that delays associated with the group are correlated with each other by that factor. As soon as a delay group is established in this manner, WaveFormer automatically recalculates the margins. For this example, FIG. 6 shows the margin entry 72 of 4 ns, a considerable improvement over the worst-case calculation (0 ns, from margin entry 50, FIG. 3).

The computer subprogram achieves the delay correlated improvement via a calculation involving equations 1–2. The results from these equations are then inserted into equation 3 where CLKDELAY2−D1 appears. Either the result of equation 1 or 2 is used, depending on which gives the most conservative (lowest) value of the margin. For the case of two delays, as in the above example, the calculation is a straightforward application of the equations.

Figure 7:
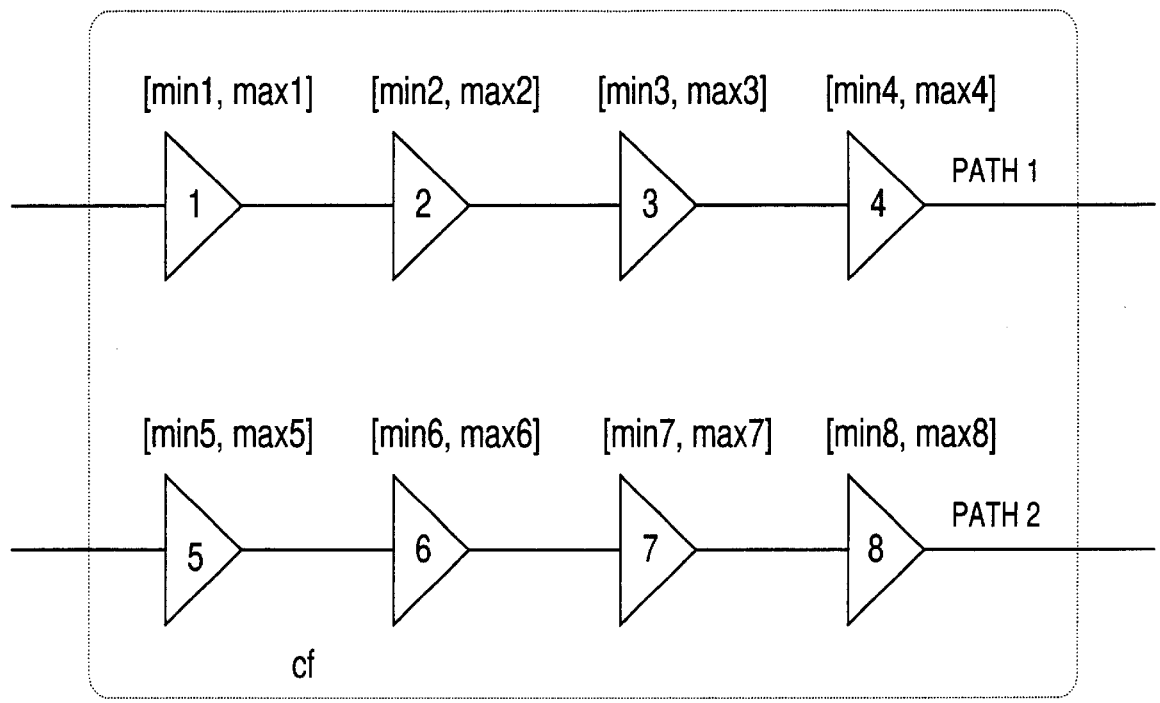
FIG. 7 is a representation of a group of gates in a two-path network having the same correlation factor which can be used by the invention to simplify calculation.
Figure 8:
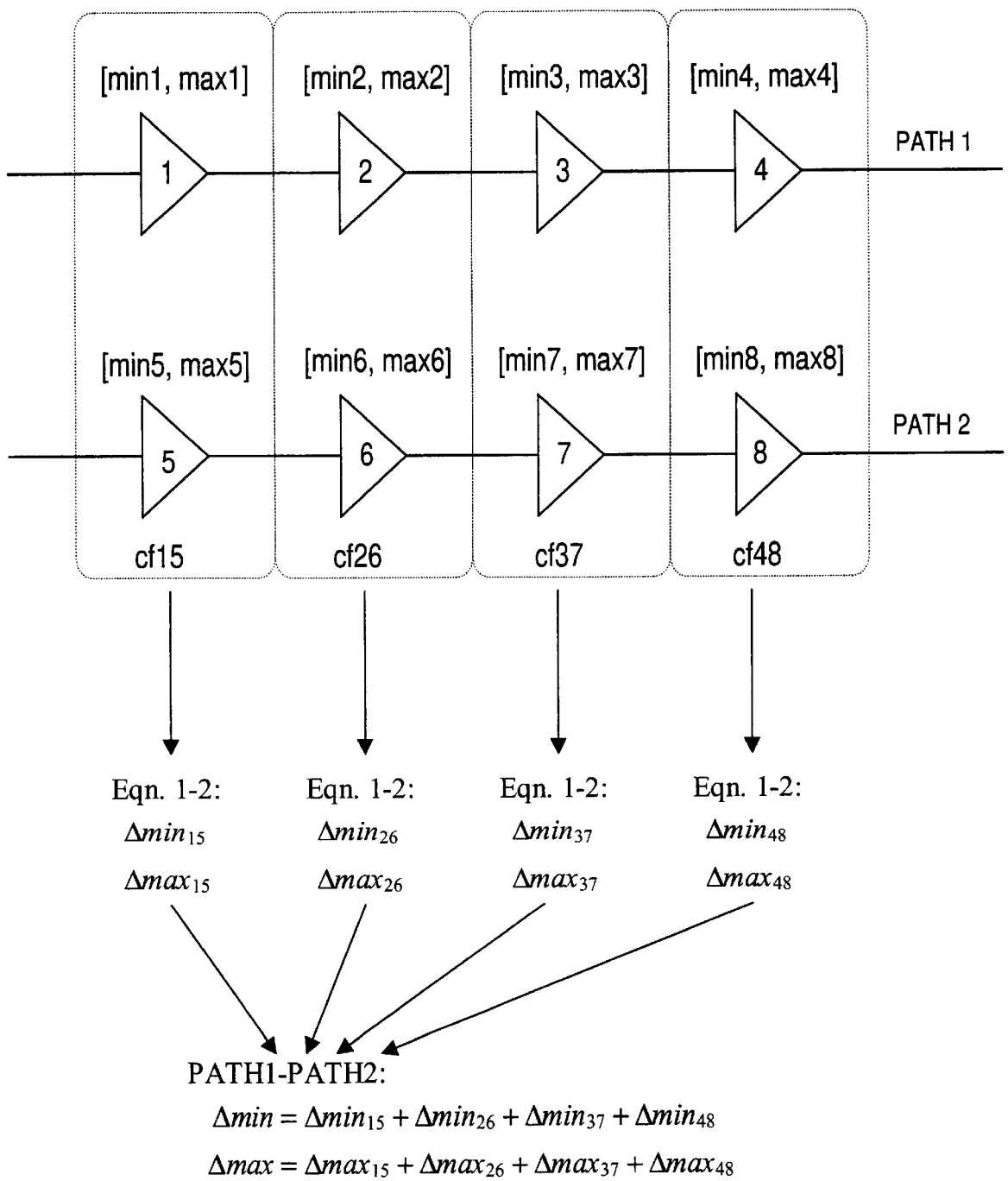
FIG. 8 is a representation of a group of gates in a two-path network having a paired correlation factor arrangement which can be used by the invention to simplify calculation.
Figure 9:
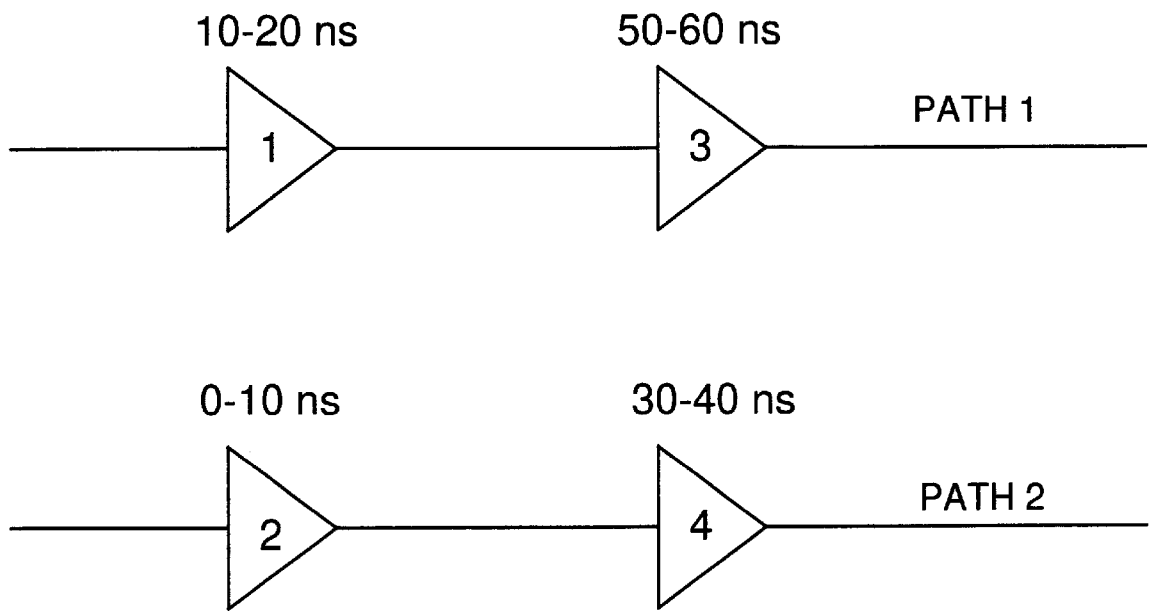
FIG. 9 is a representation of a group of gates in a two-path network having a general correlation factor arrangement which can be analyzed by the invention.

The case of more delays is illustrated with a generalized two-path network of gates shown in FIGS. 7–9. All problems involving delay correlation can be reduced to finding the relative time of arrival of a signal on one path with respect to a second path. In the example above, the objective was to find the time difference between the clock and signal paths. For the more general examples of FIGS. 7–9, the same objective holds true.

Referring to FIG. 7, a common assumption for a circuit designer to make is that all gates in the two paths of interest have the same correlation factor, cf. For PATH 1, the summation of all minimum times is made for gates 1–4 and stored in the variable $a_1$. The summation of maximum times is made and stored in $b_1$. For PATH 2, the same summations are made and stored in the variables $a_2$ and $b_2$ respectively. Using the group correlation factor, cf, these variables are inserted into equations 1–2 for calculation of the arrival time of PATH 1 with respect to PATH 2. This calculation is referred to as item 66 in FIG. 5 (Optimized Procedure 1).

Another possible situation is shown in FIG. 8 where each PATH 1 gate is correlated with a different PATH 2 gate. Each pair of gates can have an arbitrary correlation factor between them. Cases where there are an unequal number of gates on each path can be rectified by placing imaginary gates of zero delay range where needed, and pairing these to the unpaired gates. Furthermore, cases where the gates are not arranged so as to be adjacent to each other, as shown in FIG. 8, can simply be rearranged so they are. Since the analysis concerns total path times, the actual location of a gate on a path is not important. However, since this case represents the fact that delay correlation values can change along the physical dimension of the chip, it is likely that the adjacent pairing shown in FIG. 8 holds true in reality.

The subprogram handles this case in the following way (item 68 from FIG. 5, i.e. Optimized Procedure 2). The relative difference between each pair of gates is found from equations 1–2, using the correlation factor corresponding to that pair. Thus a list of min and max differences for each pair can be written. The total difference between the paths is then simply the summation of differences, as shown in FIG. 8.

The subprogram is also capable of handling a generalized situation where any one gate is correlated with any number of the other gates. This is referred to in FIG. 5 as item 70 (General Procedure). An example of this case is shown in FIG. 9 for four gates, although the extension to many gates is conceptually trivial. Correlation factors are arbitrary for any pair, and the only restriction is that no pair may have more than one correlation factor. An uncorrelated pair is taken, for computational purposes, to have a correlation factor of zero. Although this case can handle any conceivable arrangement of correlation pairs and factors, it is computationally expensive, and for this reason the program attempts to solve the aforementioned simplified cases first.

The subprogram calculates the circuit arrangement of FIG. 9 by building a table of possible delay combinations, and then subtracting the total PATH2 delays from the total PATH1 delays. By searching the list thereby generated for maximum and minimum values, the desired timing solution is obtained. However, since an infinite number of delay combinations exist, a method is required that provides the correct answer while being computationally feasible. Such a method, based on a finite set of delay combinations, is utilized by this invention.

In order to construct such a set, the subprogram attempts to assemble the minimum values for the delays in PATH1 and the maximum values for the delays in PATH2 while satisfying the correlation constraints. This would presumably lead to a minimum value of the range for the final answer when PATH2 was subtracted from PATH1. Alternatively, the maximum values of the delays in PATH1 and the minimum values in PATH2 could be assembled to produce the maximum value of the final range. The minimum and maximum values would thus provide a range for the time difference of arrival of PATH1 with respect to PATH2.

The subprogram decides arbitrarily to first minimize PATH1 and maximize PATH2. Its operation is described from this perspective, although the alternative is exactly analogous. Thus, the method will select minima for delays 1 and 3, and maxima for delays 2 and 4.

To do so, an arbitrary gate sequence is first chosen, say 1423. This means that delays are chosen in a specific order, first gate 1 then gate 4, then gate 2, and then gate 3. For gate 1, the minimum value of its delay range is selected. For gate 4, the maximum value possible is selected given its correlation constraint with gate 1. For gate 2, the minimum is selected based on both its correlations with gates 1 and 4. The maximum value for gate 3 is chosen based on its correlation with all three previous gates. In this manner four delay values are obtained which can be used to find the relative time difference between the paths. This analysis is repeated for all the different sequences that can be written for these four gates.

The table in FIG. 10 represents the systematic execution of this procedure by the subprogram. Column 1, rows R2–R25 show the twenty-four possible sequences for the gates in FIG. 9. The entry for the column heading ABCD (in row R1, column C1), means that, for each sequence, A refers to the first number, B the second number, and so forth (e.g. for sequence 1342, A=1, B=3, C=4, and D=2). By translating sequence numbers into a common lettering scheme, the subprogram is able to use one consistent technique to handle all sequences. Thus, column heading A (R1,C2) expresses the delay range for the first gate in the sequence. Column heading $B_A$ (R1,C3) expresses the delay range for the second gate based on its correlation with the first. Skipping to $D_B$(R1,C7), we have the delay range for the fourth gate based on its correlation with the second, and so forth.

Referring now to row R6, the analysis for sequence 1423 is given. Under column heading A (C2) the range for gate 1, 10–20 ns, is written, with the minimum value selected and shown in boldface. Under column heading BA (C3) gate 4's possible delay range, 30–31 ns, is shown based on the 90% correlation it has with gate 1. The maximum value of this range is also selected and shown in boldface. Note that, although gate 4 is also correlated with gates 2 and 3, these cases are not considered since their selected values have yet to be decided on. Since so far only gate 1 has been fixed, only gate 4's correlation with gate 1 is considered. Next, under column headings $C_A$ and $C_B$ gate 2's delays are written based on its correlation with gates 1 and 4. These ranges work out to 0–5 and 0–3 ns respectively. The maximum value chosen is 3 ns, since it must also satisfy the 0–5 ns constraint. If 5 ns had been chosen, delay 2 would violate its correlation constraint with delay 4 since 5 ns falls outside the range 0–3 ns. Next, under column headings $D_A$, $D_B$, and $D_C$ the same procedure is followed for gate 3's delays with respect to gates 1, 4, and 2. The minimum value, 50 ns, is chosen and verified to obey all other constraints. This value is selected by boldfacing it (R6,C6), and all the boldfaced values in row R7 now represent a set of specific delays for sequence 1423. The subprogram obtains such a set for each of the possible sequences in the circuit.

The equations used to find the delay ranges in the table of FIG. 10 are shown in FIG. 12. Given any two gates with overall delays ($[a_1,b_1]$ and $[a_2,b_2]$) such as those shown in FIG. 9, with gate 1 having a known delay within its overall range ($x_1$ within $[a_1,b_1]$) and some correlation factor (cf) between the two delays, these equations find the smaller range for gate 2 $[x_2,y_2]$ that would exist. For instance, when calculating the 1423 sequence (row R7 of FIG. 10) for case $B_A$, $x_1$ would be the selected delay for gate 1 (10 ns) and $[x_2,y_2]$ are the resulting delays for gate 4 ([30,31] ns).

The selected delay values from FIG. 10 are shown again in FIG. 11 for subsequent analysis. This table is also arranged according to gate sequence, but now the columns C2–C5 represent the fixed delay values selected for each gate. Under column C7 the total delay for PATH 1 (gates 1 and 3) is subtracted from the total delay for PATH2 gates 2 and 4), and the values stored in a list for each sequence. The final step is to select the minimum value from this list. One such value is chosen, and its corresponding row (R7) is selected and boldfaced. The value in column C7, 22 ns, represents the minimum possible arrival time of PATH1 with respect to PATH2 for sequence 2341.

Not all sequences are calculated to produce the differences shown in column C7. Those that are not are marked with an N in column C6, while those that are, are marked with a Y. The N rows represent sequences whose delay selections are not possible given the correlation constraints. To determine this, every pair of delays in a set is checked using the equations shown in FIG. 12. Thus, for sequence 1234, delays 1 and 2 are checked using $cf_{12}$, delays 1 and 3 are checked using $cf_{13}$, delays 1 and 4 are checked using $cf_{14}$, delays 2 and 3 are checked using $cf_{23}$, and so on. A delay that falls outside the $[x_2,y_2]$ range specified by the equations of FIG. 12 fails the test and its sequence is thus marked with N. No further calculation is possible using this sequence since it represents an impossible situation.

This final check is necessary because during the analysis used to generate FIG. 10, a delay pair may have been chosen which does not satisfy all other constraints. For instance, in sequence 1234 (row R2), under headings $D_A$, $D_B$, and $D_C$, three delay pairs are shown, [30,31], [33,37], and [30,39] which represent an impossible situation since any delay choice within one constraint would violate some other constraint. In general, the subprogram uses a simple method to make delay choices from among two or more ranges. If it is considering a minimum gate (1 and 3), it chooses the maximum value from among the range minima. If it is considering a maximum gate (2 and 4), it chooses the minimum value from among the range maxima. In this case, the minimum of the range maxima is 31 ns, and this is the selected value. However, since this method can generate false delay values, a subsequent check of all correlation constraints is necessary. This check could alternatively be done by simply rejecting the sequences which have two or more delay ranges that do not overlap.

The analysis above succeeded in producing a minimum time of arrival for PATH1 with respect to PATH2, but as of yet, not a maximum time. However, calculation of the maximum time, once the minimum is known, is straightforward. Any sequence that produces a minimum time will also produce the maximum time. Hence, sequence 2341 in row R27 (FIG. 11) shows the delay combination that yields the maximum time, 38 ns. Finding the fixed delays for this case is shown in FIG. 10, row R27. The procedure is exactly the same as before except now the maximum of the PATH1 gates and the minimum of the PATH2 gates is desired. By waiting to do the maximum analysis after the minimum analysis is complete, the number of calculations the subprogram is required to perform is substantially reduced.

The subprogram has now obtained the timing solution for the circuit of FIG. 9, 22–38 ns. As a circuit comprised of only four gates, this problem is computationally reasonable. The number of sequences that require analysis, however, is the factorial of the number of gates. Thus for a large number of gates the technique just described may require excessive computer time.

The subprogram uses a quicker method to handle large cases, but one which is not guaranteed to generate the optimal solution. Nevertheless, the results obtained are still better than ones assuming no delay correlation at all. The technique consists of simply reducing to zero the correlation factors that are necessary to make the problem one that can be handled by the optimized procedure 2, discussed earlier (see FIGS. 5&8). Thus, for the circuit of FIG. 9, the subprogram assigns $cf_{13}=0$, $cf_{14}=0$, $cf_{23}=0$, and $cf_{24}=0$, leaving intact only $cf_{12}$ and $cf_{34}$. Such a circuit is essentially like the arrangement shown in FIG. 8, and yields a result of 16–44 ns. This is worse than the 22–38 ns optimal solution, but considerably better than 10–50 ns, the result using no delay correlation. Alternatively, $cf_{14}$ and $cf_{23}$ are left intact with all others set to zero. Then by switching the location of gates 3 and 1 (see above comments regarding placement of gates), the same optimized procedure is executed again. This leads to a solution of 22–38 ns, a fortuitous outcome since it coincides with the optimal solution. The subprogram selects this range as the best result and reports it to the user.

This quicker version of the general procedure can take on various forms. For instance, the FIG. 9 circuit could also be reduced to a form compatible with optimized procedure 1 (FIGS. 5&7), where all gates have the same group correlation factor. To accomplish this, the smallest correlation factor, 10% in this case, is selected as the common one for the group. Since any reduction in correlation factors always leads to an equal or more conservative solution, the quicker method is guaranteed to produce a valid range.

Circuit paths can be broken up into sections representing those that are connected by correlated gates and those that are not. Since it is irrelevant to the calculation where along a path a gate is located, the gates can be rearranged in any fashion that is convenient. Thus delay correlated gates are placed together, since they can be calculated independently of the uncorrelated gates. The timing solution for the delay correlated gates can then be added to the solution for the uncorrelated gates. As a general matter, also removed from the analysis in this manner are gates whose uncertainty is zero, e.g. [15, 15], or [3, 3]. Of course, the total effect of such a delay is added back in to the solution of the correlation analysis. These steps, to remove gates whose correlation or uncertainty is zero, ensures that computer resources are not used frivolously.

Figure 13:
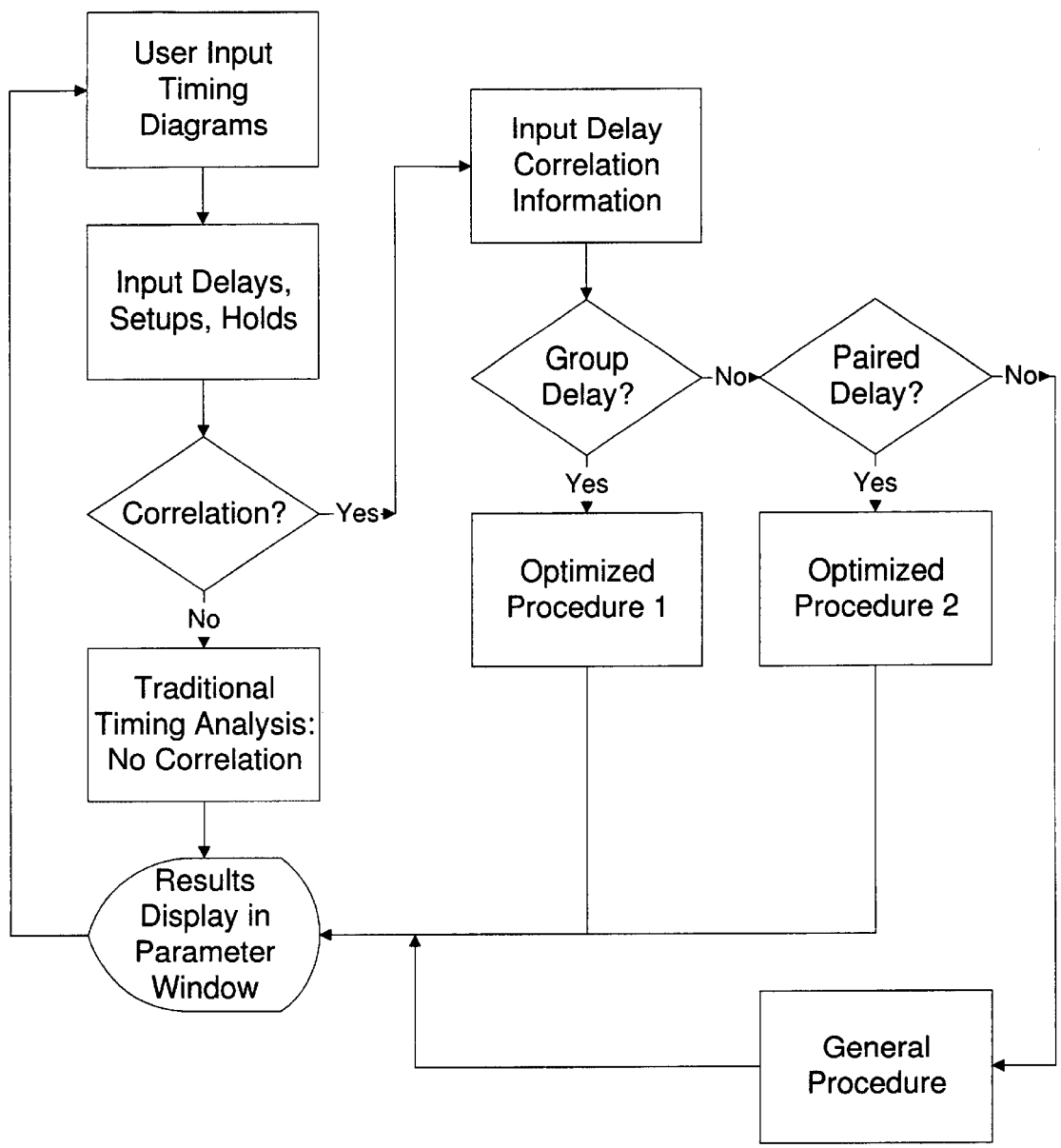
FIG. 13 is a flowchart showing preferred methodological steps in accordance with the invention.

The delay correlation subprogram is capable of deciding which of the three procedures described above to use given input to the delay correlation window 62 (FIG. 6). The flowchart of FIG. 13 shows the procedure used by this invention to gather user-input data, decide which delay correlation calculation to perform, and then performing the corresponding calculation. The user can repeat these steps indefinitely by inputting new data.

Although this specification has referred primarily to delay correlation, the invention is capable of handling correlation between other circuit timing properties, such as setup times or hold times. Any time quantity which enters a two-path analysis, and is expressible as an uncertainty range, may be correlated with any other such quantity. The subprogram handles all uncertainty ranges in exactly the same manner as previously described for delays, and does not concern itself with what type of information, per se, is being correlated. It is only the user who assigns physical meaning to timing relationships in the circuit, and to some extent the user-interface, which displays this information on a timing diagram. Thus, correlation can exist between, for instance, delays and setups, setups and holds, only setups, only holds, and so on. The subprogram thus generically handles all correlated uncertainty relationships in its timing analysis.

Constraint information such as setup times, hold times, and min/max pulse widths are used to specify timing requirements that must be met by the circuit for successful operation. Timing analysis software uses the relative time differentials between delay paths that was determined in the analysis discussed above to determine if these constraints are met. Correlation between constraints and/or constraints and delays can cause these constraints to be met, in conditions where the constraint would otherwise be violated if there was no correlation associated with the constraint. A timing constraint is verified by placing it into the timing chain of one of the two timing paths to be analyzed. It is then treated, for calculation purposes, in the same way that a delay is, and the calculation proceeds as described above. Now, however, the timing check to be satisfied consists of an inequality whereby one of the delay paths, together with the constraint, is greater than, equal to, or less than, the result of the other delay path. This check determines whether,the constraint, be it a setup or hold, has been violated. If this step yields no violation, the margin is reported showing the amount of time away from violation that the current state is. Note that several constraints can be involved in such an inequality relationship, so that in the general case, N constraints could be included on one side of the inequality and M constraints could be included on the other side. This poses no difficulty for the solution, however, as the constraints are all just treated as additional delays in the correlation calculation. The application of correlation information to constraints, as well as delays, is another novel aspect of the current invention.

This specification has thus far assumed that delay correlation information for a circuit has been either given by a manufacturer or been found by the user in some empirical fashion. In this manner, all delay correlation information could be entered into the timing analysis. Frequently, however, delay correlation information is partially available, for some of the gates on the circuit, but not all of them. A technique to find the unknown correlation information based on the known information would thus be desirable. This can be accomplished by a process of interpolation, or extrapolation, of the known data, on the basis of gate location, operating temperature, and sub-circuit boundary within the circuit. For example, assume that a first gate is related to a second by a given correlation factor, and the operating temperature, physical location, or sub-circuit boundary of the first gate is known. Then assume that a third gate exists, having the same operating temperature, physical location, or sub-circuit boundary as the first. The correlation factor between the third gate and the first would then be very close to that between the second gate and the first. Another, more complex example, is to assume that a first gate and a second gate are correlated with a third gate, although the two correlation factors are different. Then it is desired to know the correlation between a fourth gate and the third gate. If the fourth gate lies somewhere between the first and second gates in physical location, temperature, and sub-circuit boundary, then its correlation factor with the third gate can be interpolated to be somewhere between the correlation factor of the first and second gate. This idea can be used for more complex configurations involving more gates, and extrapolation of correlation information, as well as interpolation. This invention thus includes extrapolation and interpolation methods to find previously unknown delay correlation information given the known delay correlation information, together with information on the temperature, physical location, and subcircuit boundary of the gates.

What is claimed is:

1. A computer implemented method for performing a circuit timing analysis between any two paths of a timing chain using correlation information between timing relationships, including delays, setups, or holds, in a general fashion, comprising the steps of:

identifying the timing relationships required by the analysis, listing all possible sequences of timing relationships in the analysis, deciding to maximize one of the timing paths while minimizing the other, and then selecting the sequence which produces minimum and maximum arrival times.

2. A computer implemented method for performing a circuit timing analysis between any two paths of a timing chain using correlation information between timing relationships, including delays, setups, or holds, in an optimized fashion, comprising the steps of:

listing only unique pairs of correlation combinations between the paths, while ignoring the other correlation pairs, finding the arrival time of one path with respect to the other path for each correlation combination, and then summing the arrival times for all the correlation combinations, to produce the overall arrival time of a first path with respect to a second path.

3. A computer implemented method for performing a circuit timing analysis between any two paths of a timing chain using correlation information between timing relationships, including delays, setups or holds, in an optimized fashion, comprising the steps of:

grouping all the delays using a single common delay correlation percentage, expressing the grouping of delays in each path as a single delay, and then finding the arrival time of a first path with respect to a second path in a single step.

4. The method of claims 1, 2, or 3, further comprising a step for choosing which of the three previous methods to use based on a number of delays or the relationship of the delays to each other in the circuit.

5. A computer implemented method for performing a circuit timing analysis between any two paths of a timing chain using correlation information between timing relationships, including delays and constraints, comprising the steps of:

accepting input of correlation information for the constraints, performing correlation analysis with the constraints, and then determining whether or not any constraints have been violated.

6. A computer implemented method for performing a circuit timing analysis using correlation information, comprising a step of grouping three or more timing relationships, including delays, setups, or holds, in such a manner that the correlation information is specified between all possible pairs in the grouping of timing relationships, by a set of the correlation information required by a single pair of timing relationships.

* * * * *